United States Patent [19]

Rao et al.

[11] Patent Number: 4,514,265

[45] Date of Patent: Apr. 30, 1985

[54] BONDING PADS FOR SEMICONDUCTOR DEVICES

[75] Inventors: Srinivas T. Rao, Kendall Park; Frank Z. Hawrylo, Hamilton Township, Mercer County, N.J.

[73] Assignee: RCA Corporation, Princeton, N.J.

[21] Appl. No.: 627,921

[22] Filed: Jul. 5, 1984

[51] Int. Cl.³ .............................................. C25D 5/02
[52] U.S. Cl. ................................. 204/15; 204/DIG. 9
[58] Field of Search ........................... 204/15, DIG. 9

[56] References Cited

U.S. PATENT DOCUMENTS

| 2,451,341 | 10/1948 | Jernstedt | 204/DIG. 9 |
| 3,738,927 | 6/1973 | Miller | 204/228 |
| 4,082,622 | 4/1978 | Gebauer | 204/40 |
| 4,347,486 | 8/1982 | Botez | 372/46 |
| 4,465,564 | 8/1984 | Fletcher | 204/DIG. 9 |

OTHER PUBLICATIONS

IBM Technical Disclosure Bulletin, vol. 16, No. 3, Aug. 1973, pp. 979, 980.

F. H. Reid et al., "Gold Plating Technology", Electrochemical Publications Limited, (1974).
Norman M. Osero, "Pulse Plating", Metal Finishing Guidebook, (1982).

Primary Examiner—Thomas Tufariello
Attorney, Agent, or Firm—Birgit E. Morris; Theodore R. Furman

[57] ABSTRACT

An improved process for electroplating bonding pads, such as of gold, onto semiconductor devices is disclosed. Upon electrically connecting a masked semiconductor body and a suitable anode to the negative and positive terminals respectively of a power supply and submerging the wafer and anode into a suitable electrolyte, a modulated, rather than direct, current is applied to the electrolyte. A low stress, fine grain bonding pad layer is provided and, unexpectedly, non-planarities in the semiconductor body surface having a depth of about 1-3 microns can be substantially planarized when the thickness of the layer deposited is about 6-8 microns or more.

5 Claims, 6 Drawing Figures

BONDING PADS FOR SEMICONDUCTOR DEVICES

The Government has rights in this invention pursuant to a Government Contract.

BACKGROUND OF THE INVENTION

In the field of semiconductor devices it is known to have a raised metallic bump called a bonding pad on that surface of the device which is to be bonded to another body of material. For instance, electroluminescent devices such as lasers can be fabricated to include a gold or gold alloy bonding pad from several thousand angstroms (Å) to 10 micrometers ($\mu$m) and more in thickness. A corresponding bonding pad or film on a heatsink or header facilitates the thermocompression bonding of the two bodies, a process which employs an appropriate combination of temperature, pressure and time to provide a flux-free, high integrity bond.

In electrolytically depositing bonding pads, a semiconductor wafer which will subsequently be separated into individual devices is masked so as to expose the bonding pad regions of each device, typically by photolithographic techniques. The bonding pad material, such as gold, can then be electroplated onto the bonding pad regions using a suitable anode (typically platinized titanium, or the like) and the semiconductor wafer as a cathode and a DC power supply. The mask is then removed from the wafer and the wafer separated into devices, each of which will have a gold bonding pad thereon.

Several problems exist, however, in the bonding pad deposition process described above. DC plating tends to produce a mushroom-shaped gold layer providing a distorted bonding pad. This is not satisfactory for themocompression bonding which requires a smooth, planar bonding pad for optimum results. Although it is known in the electroplating art to incorporate grain refining and planarizing additives into the electrolyte, these additives provide a harder, lower purity gold deposit. Stringent requirements for semiconductor devices dictate that the bond be of a high-purity gold and thermocompression bonding requires a more malleable, rather than a harder, gold layer.

Also DC plating provides bonding pads which introduce unwanted stress in the device. This is apparent when the devices are separated from the wafer. Defects and striations are evident on the cleaved facets of semiconductor devices which have DC plated pads. Not only are these facet defects undesirable, but the stress on the device can adversely affect its opto-electronic operation.

Finally, devices which are fabricated from non-planar substrates, such as the Constricted Double Heterojunction-Large Optical Cavity (CDH-LOC) laser described in U.S. Pat. No. 4,347,486 by Botez, present a heat transfer problem. DC plating is basically conformal which results in a plated layer or pad closely resembling the non-planar device onto which it was plated. Only over extreme thicknesses, which are far beyond the practical range for bonding pads, do the non-planarities smooth away. Again, additives to planarize the deposit provide a lower purity, harder bonding gold layer. In the Botez device, the non-planarity comprises a dimple having a depth of about 1 to 3 microns. When such a device is bonded to a heatsink, this dimple results in a void in the bond. This void eliminates heat transfer in that area, which is typically at or near the laser region where the heat buildup is the greatest. The resultant thermal resistant bonds represent a serious hindrance to reliable performance of these electroluminescent devices, particularly of the Botez device.

Therefore, an improved method of depositing bonding pads onto semiconductor devices, particularly non-planar semiconductor devices, has been sought.

SUMMARY OF THE INVENTION

An improved process for electroplating bonding pads, such as of gold, onto semiconductor devices is disclosed. Upon electrically connecting a masked semiconductor body and a suitable anode to the negative and positive terminals respectively of a power supply and submerging the wafer and anode into a suitable electrolyte, a modulated, rather than direct, current is applied to the electrolyte. A low stress, fine grain bonding pad layer is provides and, unexpectedly, non-planarities in the semiconductor body surface having a depth of about 1–3 microns can be substantially planarized when the thickness of the layer deposited is about 6–8 microns or more.

DETAILED DESCRIPTION OF THE PREFERRED EMBODIMENT

Figure 1:
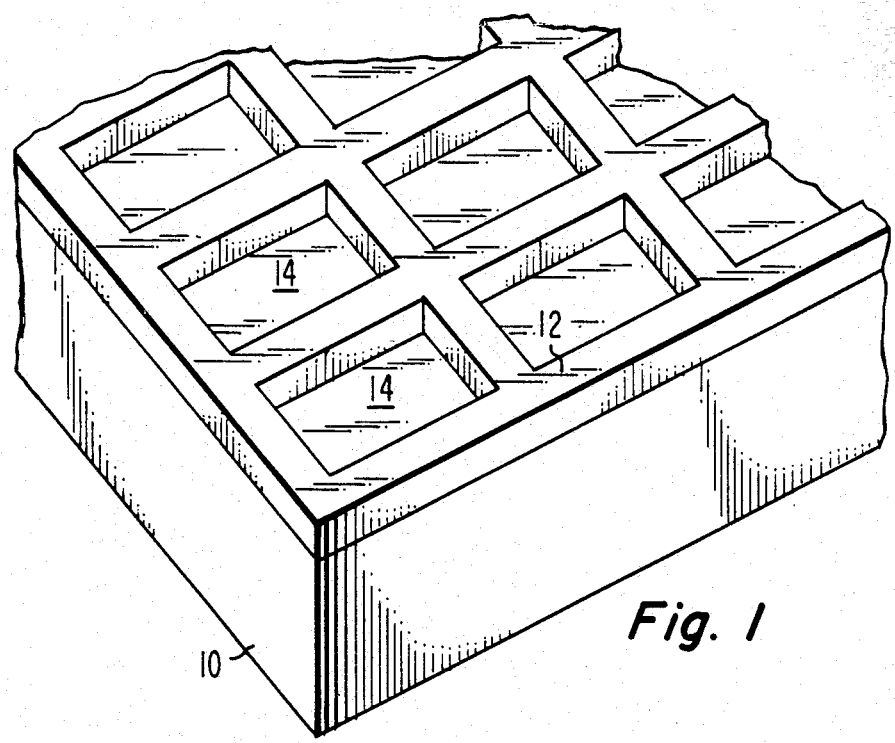
FIG. 1 illustrates a masked semiconductor wafer prior to bonding pad deposition.

A semiconductor wafer masked for the electrodeposition of bonding pads is illustrated in FIG. 1. The semiconductor wafer 10, which will later be divided into individual devices, has a patterned photoresist mask 12 thereon designed to expose the bonding pad regions 14 on the wafer 10.

Figure 2:
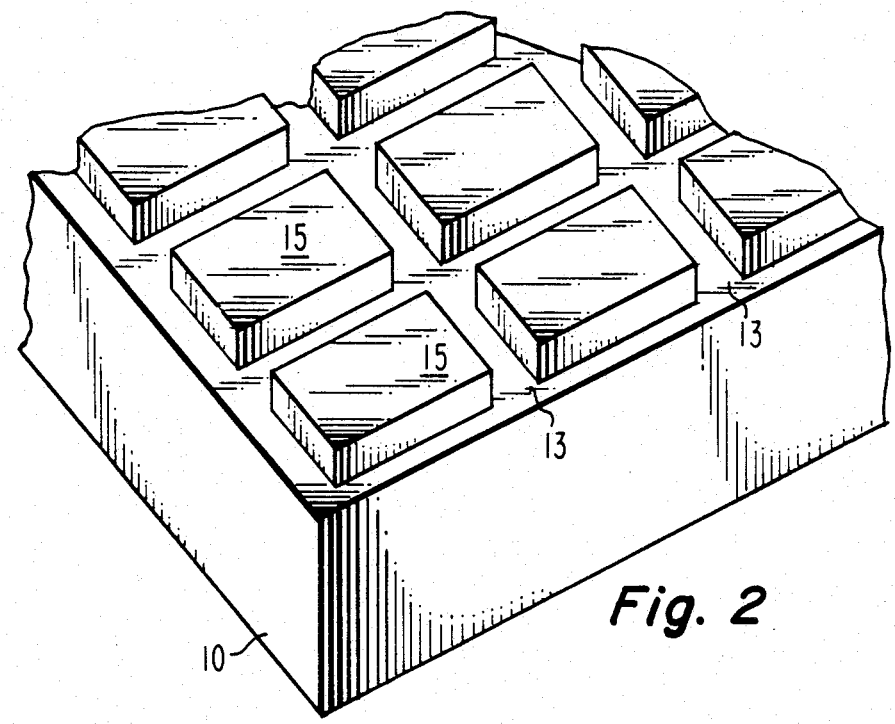
FIG. 2 illustrates a semiconductor wafer having bonding pads thereon.

FIG. 2 illustrates the semiconductor wafer 10 after electroplating and mask removal. The removal of the mask 12 leaves avenues 13 through which the wafer 10 can be cleaved for device separation. Also, bonding pads 15 have been deposited into the bonding pad regions 14 of FIG. 1.

Figure 3:
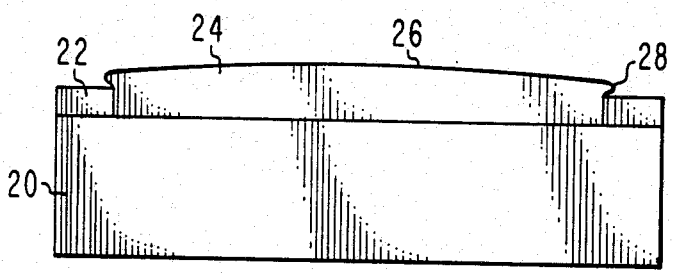
FIG. 3 illustrates a bonding pad deposited on a planar device by prior art methods.
Figure 4:
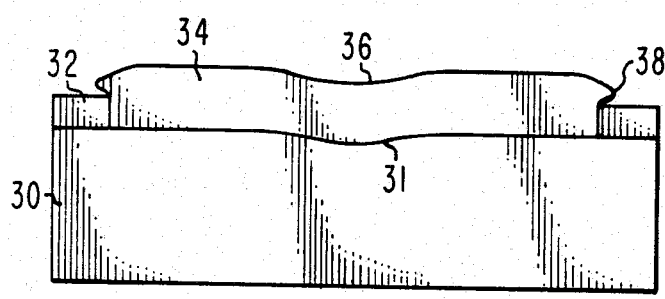
FIG. 4 illustrates a bonding pad deposited on a non-planar device by prior art methods.

FIGS. 3 and 4 illustrate bonding pads deposited by the prior art DC plating method.

FIG. 3 is a cross section of a planar device 20 with a mask 22 thereon. It can be seen that DC plating produces a bonding pad 24 of nonuniform thickness. The mushroom-like bonding pad 24 is characterized by a rounded top surface 26 and non-vertical walls 28.

FIG. 4 is a cross section of a non-planar device 30, such as a CDH-LOC laser, with a mask 32 thereon. The bonding pad 34, resulting from DC plating, is undesirable for subsequent bonding in that it has non-vertical walls 38 and a non-planar suface 36 closely resembling the surface 31 of the non-planar device 30.

Figure 5:
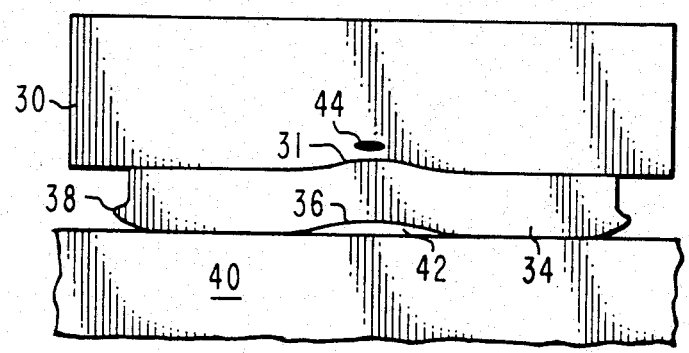
FIG. 5 illustrates bonding of a non-planar device having a prior art bonding pad.

FIG. 5, also according to the prior art, illustrates the bonding of the non-planar device 30 of FIG. 4 to a heatsink 40. It can be seen that the non-planar bonding pad surface 36 provides a void 42 in the bond. Heat transfer is extremely limited in the area of this void 42 and it can be further seen that this is typically very close to the lasing region 44 where heat buildup is at a maximum.

Pulse plating is one of several types of modulated current plating processes described in "Gold Plating Techniques" by F. H. Reid et al. Pulse plating is characterized by multiple cyclic changes in the current value, specifically a continuous rapid succession of "off" and "on" current supply.

Pulse plating is utilized in applications where low stress and enhanced uniformity of thickness of the deposited layer are required. During the "off" portions of the plating cycle, the already deposited lattice relaxes before further deposition. In addition, the metal-depleted electrolyte layer adjacent to the workpiece plating surface is replenished by the electrolyte by diffusion or stirring. Pulse plating also is known to provide straing walls for the deposited layer, a fine grain structure and low porosity.

The enhanced thickness uniformity known for pulse plated deposits suggests that a bonding pad pulse plated over a non-planar substrate would follow the contour of the substrate, i.e., a uniformly thick layer plated over a non-planar substrate would be similarly non-planar. Unexpectedly, however bonding pads pulse plated over CDH-LOC devices having about 1–3 microns deep depressions had substantially planar surfaces after only 6–8 microns of material was deposited.

Figure 6:
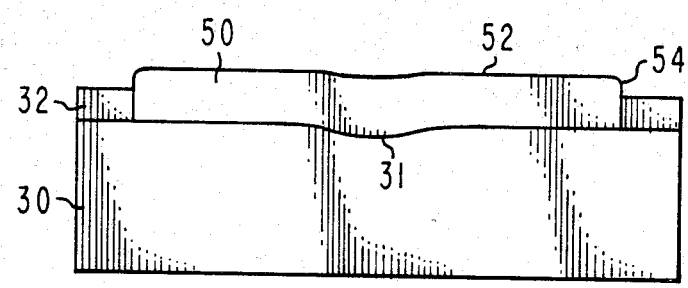
FIG. 6 illustrates a non-planar device having a bonding pad deposited according to the present invention.

FIG. 6 illustrates the results provided by the present invention. The cross section shows a non-planar device 30 with a mask 32 thereon. The bonding pad 50 deposited by pulse plating can be seen to have a planarized bonding surface 52 with vertical side walls 54. This planarized bond pad 50 is felt to enhance the bond formed between the device 30 and the heatsink. This, in turn, should provide better dissipation of heat from the device during operation.

To carry out the present process, a pulse power supply capable of providing rapid, continuous "off-on" current to the electrolyte is required. The present invention can be employed with any electrolyte. Bonding pads deposited in accordance with the present invention can employ any duty cycle (ratio of "on " time to "on" plus "off" time expressed in percent) depending on the qualities required in the devices. For gold bonding pads on non-planar semiconductor devices, a 10–20 percent duty cycle is preferred. The peak current during the "on" portion can be 2 to 10 times greater than the direct current used by prior art methods for the same electrolyte, as is known in the art.

The present invention will now be described by the following Example but is not meant to be limited to the details therein.

EXAMPLE

A 0.5"×0.5" (1.27 cm×1.27 cm) Aluminum Gallium Arsenide semiconductor wafer consisting of a plurality of CDH-LOC non-planar devices was masked with photoresist such that a 6 mil×10 mil (150×250 μm) bonding pad region was exposed on the surface of each device. The wafer was electrically connected to the negative terminal of a pulse current power supply. A platinized titanium anode was electrically connected to the positive terminal. The wafer and anode were submerged in a 60° C. proprietary gold electrolyte, PUR-A-GOLD 125, available from the Sel-Rex Company in Nutley, N.J. The deposition was carried out using a current pulse at 1 KHz with a 10 percent duty cycle which provided that the current was on for 0.1 millisecond and off for 0.9 millisecond repeatedly. The peak current density during the "on" period was about 12 milliamps/cm$^2$. The deposition was carried out for 3.5 minutes with a deposition rate of about 2 microns/minute, thereby providing 7 micron thick bonding pads. The surface of each bonding pad was substantially planar.

We claim:

1. In a method of electroplating one or more bonding pads onto the surface of a nonplanar semiconductor body comprising
   connecting the semiconductor body to a negative terminal of a power supply;
   connecting a suitable anode to a positive terminal of said power supply;
   submerging the semiconductor device and the anode into an electrolyte solution of the bonding pad material; and
   applying a direct current from the power supply to the electrolyte so that a layer of bonding pad material of the desired thickness is deposited onto the semiconductor body; the improvement comprising
   modulating the current such that it is turned off and on continuously during the deposition whereby the non-planarities are substantially planarized and a bonding pad layer having low stress, a fine grain structure and straight walls is provided.

2. The method of claim 1 wherein the non-planar devices include a depression of about 1–3 micrometers in depth.

3. The method of claim 1 wherein the bonding pad material is gold.

4. The method of claim 3 wherein the current is modulated at a duty cycle of 10–20 percent.

5. The method of claim 4 wherein a peak current density during modulation is 2 to 10 times greater than the current density employed without modulation.

* * * * *